(12) United States Patent
Shepard et al.

(10) Patent No.: US 9,837,471 B2
(45) Date of Patent: Dec. 5, 2017

(54) DUAL OTS MEMORY CELL SELECTION MEANS AND METHOD

(71) Applicant: Western Digital Technologies, Inc., San Jose, CA (US)

(72) Inventors: Daniel Robert Shepard, North Hampton, NH (US); Mac D. Apodaca, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/098,963

(22) Filed: Apr. 14, 2016

(65) Prior Publication Data

US 2017/0301732 A1 Oct. 19, 2017

(51) Int. Cl.
*H01L 27/10* (2006.01)
*H01L 27/24* (2006.01)

(52) U.S. Cl.
CPC ...... *H01L 27/2481* (2013.01); *H01L 27/2427* (2013.01)

(58) Field of Classification Search
None
See application file for complete search history.

(56) References Cited

U.S. PATENT DOCUMENTS

| | | | |
|---|---|---|---|
| 8,488,374 B2 | 7/2013 | Liu | |
| 8,766,234 B1 | 7/2014 | Hashim et al. | |
| 8,923,032 B2 | 12/2014 | Shimakawa et al. | |
| 9,118,004 B2 | 8/2015 | Bresolin et al. | |
| 9,147,439 B2 | 9/2015 | Cernea et al. | |
| 9,172,037 B2 | 10/2015 | Somaschini et al. | |
| 2009/0244796 A1* | 10/2009 | Tang | H01L 27/0251 361/56 |
| 2009/0310402 A1* | 12/2009 | Parkinson | G11C 13/0004 365/163 |
| 2010/0232200 A1* | 9/2010 | Shepard | G11C 13/0004 365/51 |
| 2013/0194855 A1* | 8/2013 | Franca-Neto | H01L 27/2481 365/72 |
| 2014/0063888 A1* | 3/2014 | Lee | G11C 5/025 365/63 |
| 2014/0204646 A1* | 7/2014 | Franca-Neto | H01L 27/2481 365/72 |
| 2015/0044849 A1 | 2/2015 | Pio | |

OTHER PUBLICATIONS

Jo, et al.; 3D-stackable Crossbar Resistive Memory based on Field Assisted Superlinear Threshold (FAST) Selector; dated 2014; 4 total pages.

* cited by examiner

*Primary Examiner* — Sitaramarao S Yechuri
(74) *Attorney, Agent, or Firm* — Patterson & Sheridan, LLP

(57) ABSTRACT

A 3D cross-point memory array includes a bitline and a word line. Both the bitline and the word line have multiple selector switches. Each switch of a corresponding bitline or word line is connected to a horizontal conductor or a vertical conductor so that a given bitline or word line has two switches, a horizontal conductor and a vertical conductor. By activating a particular horizontal conductor and vertical conductor, a specific bitline or word line is selected.

29 Claims, 7 Drawing Sheets

DUAL OTS MEMORY CELL SELECTION MEANS AND METHOD

BACKGROUND OF THE DISCLOSURE

Field of the Disclosure

Embodiments of the present disclosure generally relate to a 3D cross-point memory array utilizing multiple selector switches along a bitline.

Description of the Related Art

The heart of a computer is a magnetic recording device which typically includes a rotating magnetic media or a solid state media device. A number of different memory technologies exist today for storing information for use in a computing system. These different memory technologies may, in general, be split into two major categories: volatile memory and non-volatile memory. Volatile memory may generally refer to types of computer memory that requires power to retain stored data. Non-volatile memory, on the other hand, may generally refer to types of computer memory that do not require power in order to retain stored data.

One type of memory that is gaining traction in industry is 3D cross-point memory arrays. 3D cross-point memory arrays can select a cell by using an ovonic threshold switch (OTS) device in series with a memory element, but selection of the 3D layer is typically done with decoding transistor logic in the substrate combined with a plurality of decoded lines connecting vertically to the individual layers in an outward fanning, stair step-like pattern. Such an approach is complex, requires more substrate area and thus reduces memory array area to logic area efficiency.

Therefore, there is a need in the art for a 3D cross-point memory array that is less complex, requires less substrate area and operates efficiently.

SUMMARY OF THE DISCLOSURE

The present disclosure generally relates to a 3D cross-point memory array. The 3D cross-point memory array includes a bitline and a word line. Both the bitline and the word line have multiple selector switches. Each switch of a corresponding bitline or word line is connected to a horizontal conductor or a vertical conductor so that a given bitline or word line has two switches, a horizontal conductor and a vertical conductor. By activating a particular horizontal conductor and vertical conductor, a specific bitline or word line is selected.

In one embodiment, a 3D cross-point memory array comprises a bitline; a first selector switch coupled to the bitline; a second selector switch coupled to the bitline; a memory element coupled to the bitline; and a third selector switch coupled to the memory element. It is to be understood that the third selector switch may be integral to the memory element. For integral selector switches, phase change memory is contemplated. Furthermore, the third selector switch may be a four-layer diode or an OTS switch or a current steering device such as a diode.

In another embodiment, a 3D cross-point memory array comprises at least one bitline; a first selector switch coupled to the at least one bitline; a second selector switch coupled to the at least one bitline; at least one word line; a third selector switch coupled to the at least one word line; a fourth selector switch coupled to the at least one word line; and at least one memory element coupled between the at least one bitline and the at least one word line. It is to be understood that the memory element has a selector switch that may be coupled to the memory element or may be integral to the memory element. For integral selector switches, phase change memory is contemplated. Furthermore, the selector switch may be a four-layer diode or an OTS switch or a current steering device such as a diode.

In another embodiment, a 3D cross-point memory array comprises a plurality of bitlines, wherein each bitline has a first connection point and a second connection point; a first conductor; a first selector switch coupled between each first connection point and the first conductor; a second conductor; a second selector switch coupled between each second connection point and the second conductor; a plurality of word lines, wherein each word line has a third connection point and a fourth connection point; a third conductor; a third selector switch coupled between each third connection point and the third conductor; a fourth conductor; a fourth selector switch coupled between each fourth connection point and the fourth conductor; and a plurality of memory elements coupled between the plurality of bitlines and the plurality of word lines

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a 3D cross-point memory array. The 3D cross-point memory array includes a bitline and a word line. Both the bitline and the word line have multiple selector switches. Each switch of a corresponding bitline or word line is connected to a horizontal conductor or a vertical conductor so that a given bitline or word line has two switches, a horizontal conductor and a vertical conductor. By activating a particular horizontal conductor and vertical conductor, a specific bitline or word line is selected.

Figure 1:
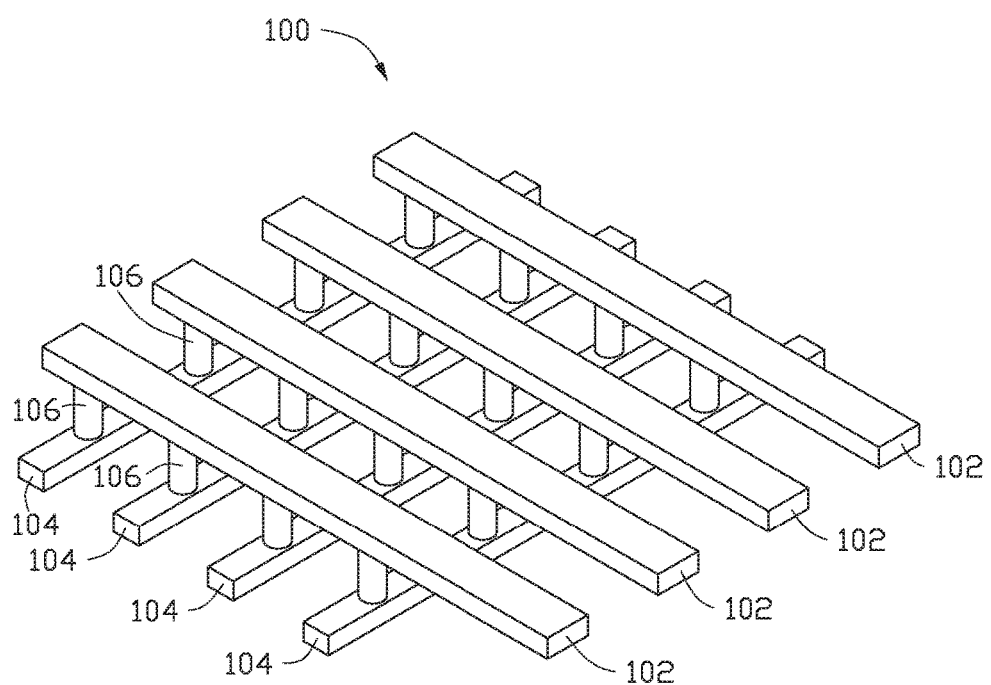
FIG. 1 is a schematic isometric illustration of a cross-point array according to one embodiment.

FIG. 1 is a schematic isometric illustration of a cross-point array 100 according to one embodiment. The array 100 includes a plurality of bitlines 102 and a plurality of word lines 104 with a plurality of memory elements 106 disposed therebetween. The bitlines 102 are all disposed in a common plane and arranged parallel to one another. It is to be understood that while four bitlines 102 have been shown, more or less bitlines 102 may be present. The word lines 104 are all disposed in a common plane and arranged parallel to one another. It is to be understood that while four word lines 104 have been shown, more or less bitlines 104 may be present. Furthermore, the bitlines 102 and word lines 104 are each disposed in separate planes, but the bitlines 102 and word lines 104 are arranged perpendicular to one another. The memory devices 106 are arranged such that when a single bitline 102 is selected and a single word line 104 is selected, a single, specific memory device 106 is selected for reading/writing.

The present disclosure involves selecting a vertical conductor from a plurality of vertical conductors whereby any given vertical conductor connects to all of the bitlines stacked one above the other in a 3D cross-point memory array wherein each connection of a bitline to such a vertical conductor is made through a first selector switch, such as an ovonic threshold switch (OTS) selector. Likewise, selecting a horizontal conductor from a plurality of horizontal conductors whereby any given horizontal conductor connects all of the bitlines in a given layer of that 3D cross-point memory array wherein each connection of a bitline to a horizontal conductor is made through a second selector switch. The plurality of vertical conductors and the plurality of horizontal conductors form a cross-point matrix from which a single bitline can be selected from all the bitlines in all the layers by selecting one vertical conductor and one horizontal conductor. In this way, the bitline selection is accomplished at the individual bitline and not in the substrate. This reduces the number of vertical connections and the amount of substrate based decode logic required and thereby eliminates the stairstep-like vertical interconnect pattern of the prior art that is detrimental to array area efficiency. Word lines in adjacent layers (above and below) can be likewise selected.

Figure 2:
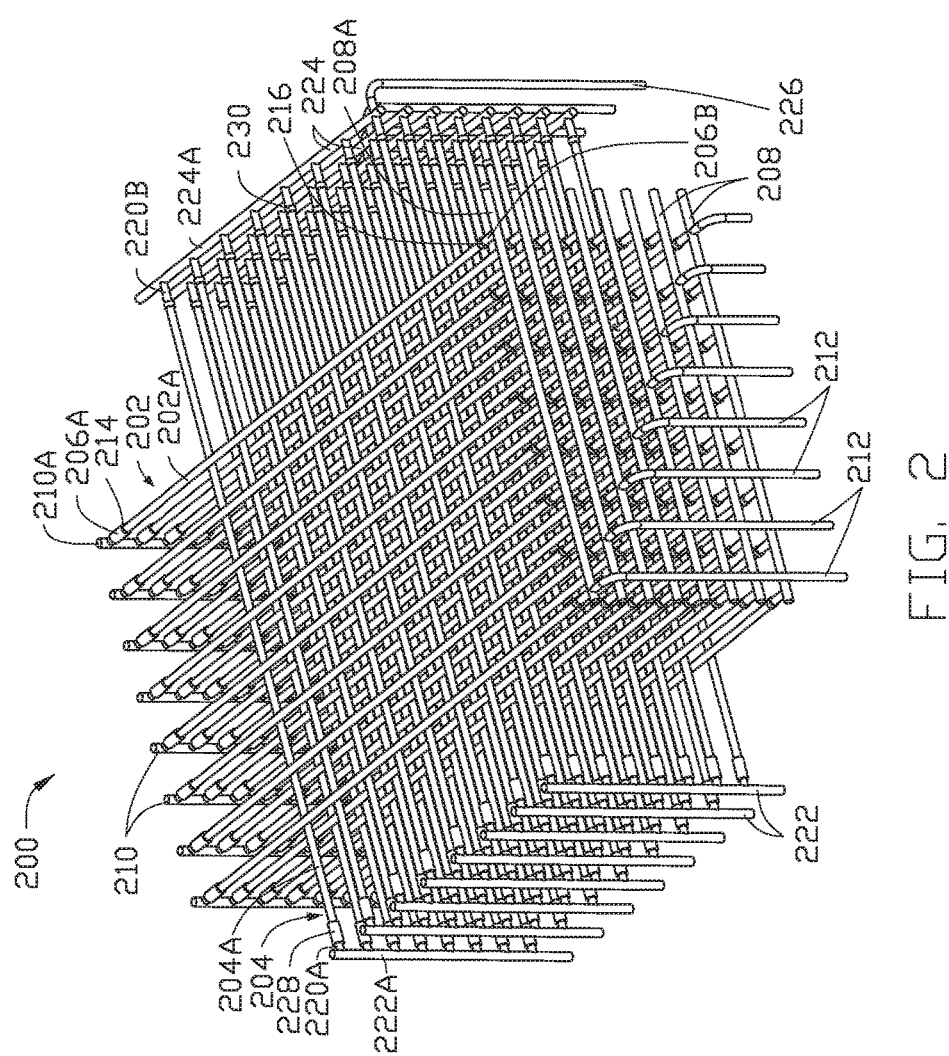
FIG. 2 is a schematic isometric illustration of a cross-point array according to another embodiment.

FIG. 2 is a schematic isometric illustration of a cross-point array 200 according to another embodiment. The array 200, as illustrated, has a plurality of bitlines 202 and a plurality of word lines 204. The bitlines 202 and the word lines 204 are arranged perpendicular to one another, but in different planes. In the embodiment shown in FIG. 2, there are sixty four total bitlines 202. The bitlines 202 are all parallel to one another. The bitlines 202 are arranged in eight different horizontal planes with each plane having eight different bitlines 202. The bitlines 202 within a given horizontal plane are all horizontally aligned and parallel. Additionally, the bitlines 202 are aligned in eight different vertical planes so that the bitlines 202 within a given vertical plane are all vertically aligned and parallel. It is to be understood that while sixty four bitlines 202 are shown, more or less bitlines 202 may be present.

In the embodiment shown in FIG. 2, each bitline 202 has two ends 206A, 206B. Each end 206A, 206B of a bitline 202 is coupled to a corresponding conductor 208, 210. As shown in FIG. 2, one conductor 208 extends in a horizontal plane to connect eight bitlines 202, and the other conductor 210 extends in a vertical plane to connect eight bitlines 202. The vertical conductor 210 connects to a substrate (not shown). To connect the horizontal conductor 208 to the substrate, an additional vertical conductor 212 is utilized. Due to the horizontal conductors 208 and the vertical conductors 210, an individual bitline 202 may be selected. To select an individual bitline 202, a voltage is provided to horizontal conductor 208, such as conductor 208A. By providing voltage to horizontal conductor 208A, all bitlines 202 connected to conductor 208A receive a current. Voltage is also provided to a vertical conductor 210, such as conductor 210A. By applying voltage to vertical conductor 210A, all bitlines 202 coupled to conductor 210A receive current. However, there is only a single bitline 202A that receives voltage from both conductor 208A and conductor 210A. Thus, bitline 202A is the only bitline selected by delivering current to conductors 208A and 210A. The voltage that is applied to the vertical conductor 210A is opposite polarity to the voltage delivered to the horizontal conductor 208A. Furthermore, each bitline 202 includes a first selector switch 214 that is adjacent to one end 206A of the bitline 202 and a second selector switch 216 that is adjacent to the other end 206B of the bitline 202. In one embodiment, the selector switches 214, 216 may be ovonic threshold switches. In another embodiment, the selector switches 214, 216 may be identical. In another embodiment, the selector switches 214, 216 may be different types of selector switches. There is a connection point between each end 206A, 206B of the bitline 202 and the respective selector switch 214, 216. Additionally, there is a connection point between each selector switch 214, 216 and the corresponding conductor 208, 210.

In the embodiment shown in FIG. 2, there are sixty four total word lines 204. The word lines 204 are all parallel to one another. The word lines 204 are arranged in eight different horizontal planes with each plane having eight different word lines 204. The word lines 204 within a given horizontal plane are all horizontally aligned and parallel. Additionally, the word liens 204 are aligned in eight different vertical planes so that the word lines 204 within a given vertical plane are all vertically aligned and parallel. It is to be understood that while sixty four word lines 204 are shown, more or less word lines 204 may be present.

In the embodiment shown in FIG. 2, each word line 204 has two ends 220A, 220B. Each end 220A, 220B of a word line 204 is coupled to a corresponding conductor 222, 224. As shown in FIG. 2, one conductor 224 extends in a horizontal plane to connect eight word lines 204, and the other conductor 222 extends in a vertical plane to connect eight word lines 204. The vertical conductor 222 connects to a substrate (not shown). To connect the horizontal conductor 224 to the substrate, an additional vertical conductor 226 is utilized. Due to the horizontal conductors 224 and the vertical conductors 226, an individual word line 204 may be selected. To select an individual word line 204, a voltage is provided to horizontal conductor 224, such as conductor 224A. By providing voltage to horizontal conductor 224A, all word lines 204 connected to conductor 224A receive a current. Voltage is also provided to a vertical conductor 222, such as conductor 222A. By applying voltage to vertical conductor 222, all word lines 204 coupled to conductor 222A receive current. However, there is only a single word line 204A that receives voltage from both conductor 222A and conductor 224A. Thus, word line 204A is the only word line selected by delivering current to conductors 222A and 224A. The voltage that is applied to the vertical conductor 222A is opposite polarity to the voltage delivered to the horizontal conductor 224B. Furthermore, each word line 204 includes a first selector switch 228 that is adjacent to one end 220A of the word line 204 and a second selector switch 230 that is adjacent to the other end 220B of the word line 204. In one embodiment, the selector switches 228, 230 may be ovonic threshold switches. In another embodiment, the selector switches 228, 230 may be identical. In another embodiment, the selector switches 228, 230 may be different types of selector switches. In one embodiment, selector switches 214, 216, 228, 230 may be identical. In another embodiment, the selector switches 214, 216, 228, 230 may be different types of selector switches. There is a connection point between each end 220A, 220B of the word line 204 and the respective selector switch 228, 230. Additionally, there is a connection point between each selector switch 228, 230 and the corresponding conductor 222, 224.

Selection is accomplished by applying a first voltage to one of the plurality of vertical conductors 210 and a second voltage of reverse polarity to one of the horizontal conductors 208 by means of a vertical conductor 212 from the substrate to the horizontal conductor 208 with a purpose of applying a voltage across the two selector switches 214, 216 connected to the intended bitline 202. The two selector switches 214, 216 connecting to a given bitline 202 form a voltage divider thereby keeping the voltage on the bitline 202 near zero. Other first and second applied voltages can be used to bias the bitline 202 at a different voltage. As will be discussed below with regards to FIG. 4, while drawn at opposite ends of the bitlines 202 for ease of discussion on operation, first and second selector switches 214, 216 may be fabricated at same end of bitline 202 in close proximity. Note that the vertical conductors 210 show that all of the bitline connections in all of the layers can be brought down to logic in the substrate for driving the selection means along the array without the need to expand these vertical conductors 210 in a stairstep-like pattern. Additionally, the vertical conductors 212 show that all of the bitline connections in each of the layers can be brought down from the horizontal conductors 208 to logic in the substrate for driving the selection means with vertical conductors 212 along the near edge of the array 200 without the need to expand these vertical conductors 212 in a stairstep-like pattern.

For the word lines 204, selection is accomplished in a similar manner by applying a first voltage to one of the plurality of vertical conductors 222 and a second voltage of reverse polarity to one of the horizontal conductors 224 by means of a vertical conductor 226 from the substrate to the horizontal conductor 224 with a purpose of applying a voltage across the two selector switches 228, 230 connected to the intended word line 204. The two selector switches 228, 230 connecting to a given word line 204 form a voltage divider thereby keeping the voltage on the word line 204 near zero. Other first and second applied voltages can be used to bias the word line 204 at a different voltage. As will be discussed below with regards to FIG. 5, while drawn at opposite ends of the word line 204 for ease of discussion on operation, first and second selector switches 228, 230 may be fabricated at same end of word line 204 in close proximity. Note that the vertical conductors 222 show that all of the word line connections in all of the layers can be brought down to logic in the substrate for driving the selection means along the array without the need to expand these vertical conductors 222 in a stairstep-like pattern. Additionally, the vertical conductors 226 show that all of the word line connections in each of the layers can be brought down from the horizontal conductors 224 to logic in the substrate for driving the selection means with vertical conductors 226 along the near edge of the array 200 without the need to expand these vertical conductors 226 in a stairstep-like pattern. In one embodiment, selector switches 216, 230 may comprise capacitors such that a bitline and word line are selected simultaneously by capacitive coupling current through selector switches 216, 230 in order to switch on corresponding selector switches 2214, 228 respectively.

The bitline and word line selector switches can be fabricated simultaneously with the selection devices used for individual bits within a memory array. Formation of the selector switches can use a subtractive process where the selector switch material is deposited, followed by photo-lithographic or other mask patterning, then utilizing an etch such as reaction ion etching to remove all unneeded material and leave pillars of the selector switches. In the case of forming an OTS device as the selector switch, OTS materials include but are not limited to the following constituents: Ge, Sb, Te, As, Se, S, Si, In.

Figure 3:
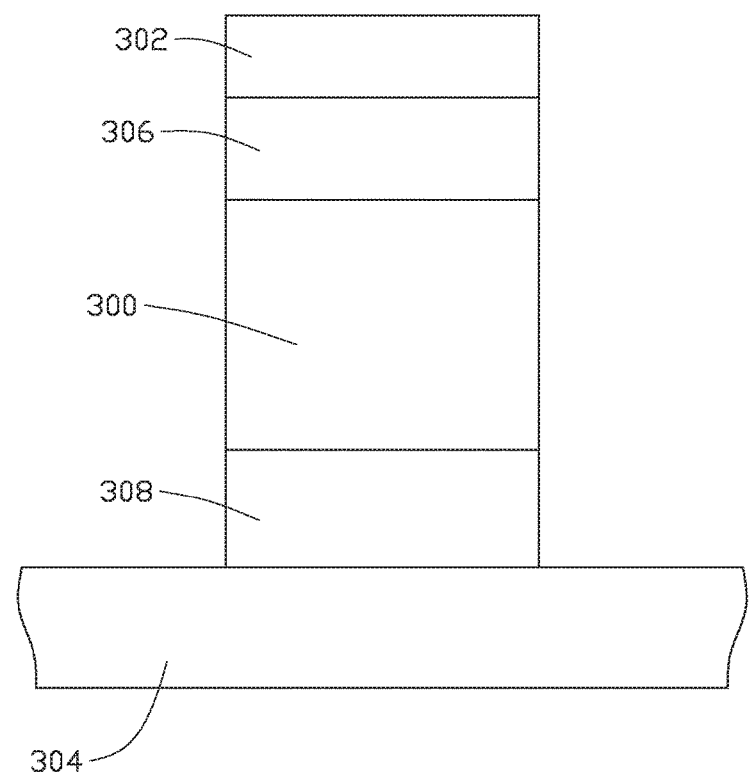
FIG. 3 is a schematic illustration of a memory device coupled to a bitline and a word line.

FIG. 3 is a schematic illustration of a memory device 300 coupled to a bitline 302 and a word line 304. Selector switches 306, 208 are shown on either side of the memory device 300 and coupled to a respective bitline 302 or word line 304. Two selector switches 306, 308 are shown, but it is to be understood that only a single selector switch needs to be connected to the memory device 300. Two selector switches 306, 308 are shown simply to illustrate that the selector switch 306, 308 may be coupled between the memory device 300 and either the bitline 302 or the word line 304. In one embodiment, the selector switch 306, 308 may comprise an OTS device. In another embodiment, selector switches 214, 216, 228, 230, 306, 308 may be identical. In another embodiment, the selector switches 214, 216, 228, 230, 306, 308 may be different types of selector switches. It is to be understood that while the memory device 300 is shown as a simple structure, multiple other layers may comprise the memory device 300 such as materials for thermal isolation, chemical barriers layers to prevent mixing and diffusion, and an adhesion layer.

Figure 4:
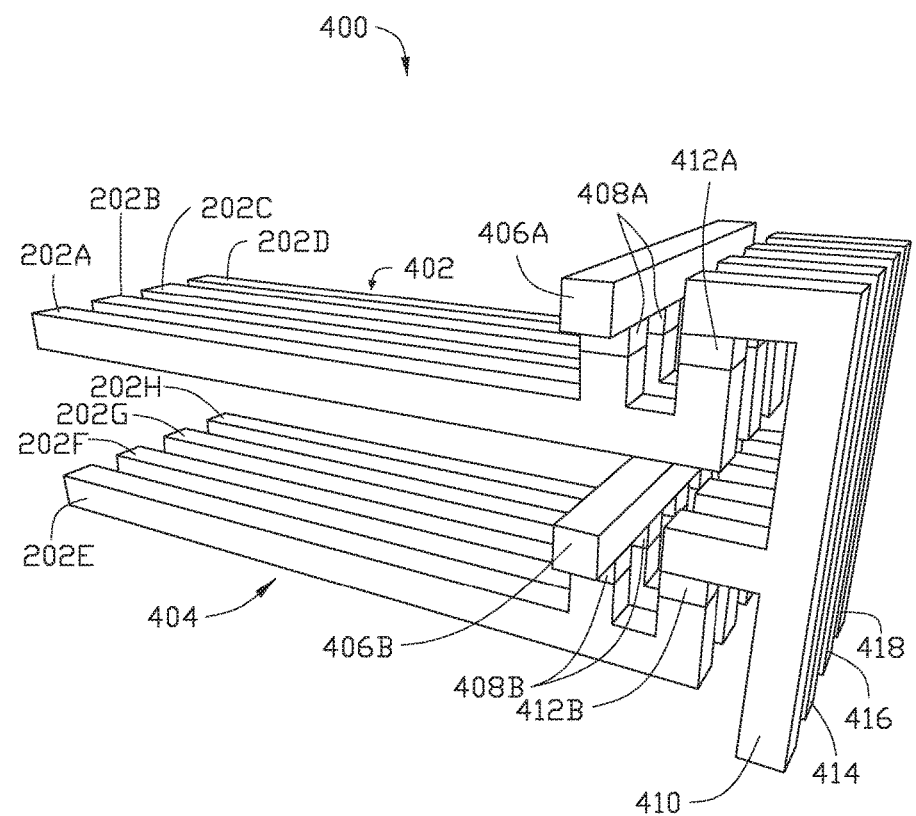
FIG. 4 is a schematic isometric illustration of bitlines of a cross-point array according to one embodiment.

FIG. 4 is a schematic isometric illustration of bitlines 202A-202H of a cross-point array 400 according to one embodiment. In the embodiment shown in FIG. 4, there is an upper array layer 402 with bitlines 202A-202D and a lower array layer 404 with bitlines 202E-202H. The upper array layer 402 connects to a horizontal conductor 406A through selector switches 408A, and the lower array layer 404 connected to a horizontal conductor 406B through selector switches 408B. Bitlines 202A, 202E are connected to vertical conductor 410 through selector switches 412A, 412B. Bitlines 202B, 202F are connected to vertical conductor 414 through selector switches. Bitlines 202C, 202G are connected to vertical conductor 416 through selector switches. Bitlines 202D, 202H are connected to vertical conductor 418 through selector switches. In the embodiment shown in FIG. 4, the connections from the bitlines 202A-202H to the respective conductors 406A, 406B, 410, 414, 416, 418 is made at the same end of the bitlines 202A-202H. There is a connection point between each bitline and the respective selector switches. Additionally, there is a connection point between each selector switch and the corresponding conductor.

Figure 5:
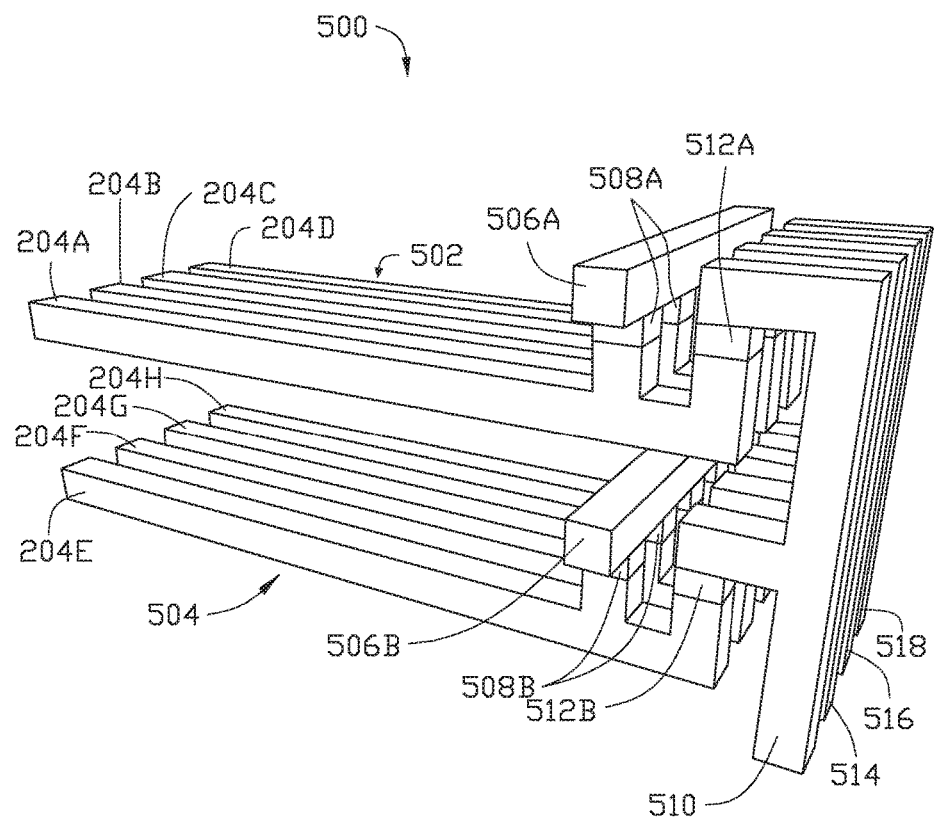
FIG. 5 is a schematic isometric illustration of word lines of a cross-point array according to one embodiment.

FIG. 5 is a schematic isometric illustration of word lines 204A-204H of a cross-point array 500 according to one embodiment. In the embodiment shown in FIG. 5, there is an upper array layer 502 with word lines 204A-204D and a lower array layer 504 with word lines 204E-204H. The upper array layer 502 connects to a horizontal conductor 506A through selector switches 508A, and the lower array layer 504 connected to a horizontal conductor 506B through selector switches 508A. Word lines 204A, 204E are connected to vertical conductor 510 through selector switches 512A, 512B. Word lines 204B, 204F are connected to vertical conductor 514 through selector switches. Word lines 204C, 204G are connected to vertical conductor 516 through selector switches. Word lines 204D, 204H are connected to vertical conductor 518 through selector switches. In the embodiment shown in FIG. 5, the connections from the word lines 204A-204H to the respective conductors 506A, 506B, 510, 514, 516, 518 is made at the same end of the word lines 204A-204H. There is a connection point between each word line and the respective selector switches. Additionally, there is a connection point between each selector switch and the corresponding conductor.

Figure 6:
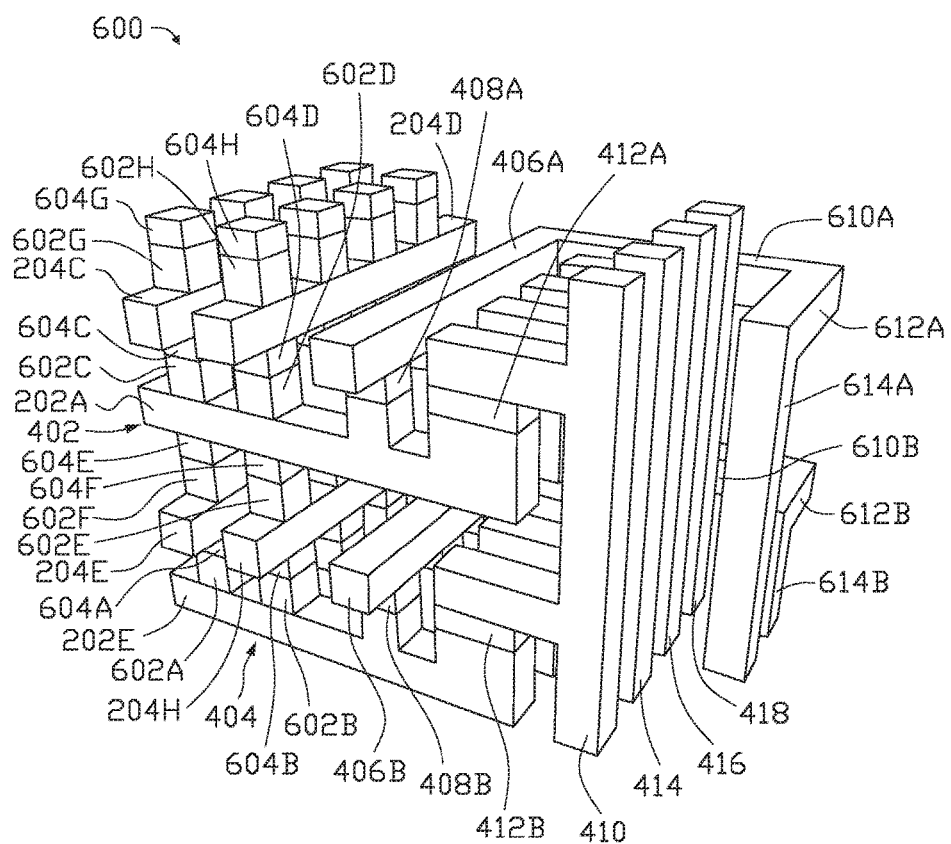
FIG. 6 is a schematic isometric illustration of bit lines and word lines of a cross-point array according to one embodiment.

FIG. 6 is a schematic isometric illustration of bitlines and word lines of a cross-point array 600 according to one embodiment. As shown in FIG. 6, memory elements 602A-602H with selector switches 604A-604H between the bitlines 202A, 202E and word lines 204C, 204D, 204G, 204H. The horizontal conductors 406A, 406B are shown to wrap around the vertical conductors 410, 414, 416, 418 so that the horizontal conductors 406A, 406B connect to the substrate on the same side as the vertical conductors 410, 414, 416, 418 for the bitlines 202A, 202E. The connection is made from the horizontal conductors 406A, 406B through respective first elements 610A, 610B, respective second elements 612A, 612B and respective third elements 614A, 614B. Respective first elements 610A, 610B, second elements 612A, 612B and the horizontal conductors 406A, 406B are all disposed in within the same plane for a given horizontal conductor 406A, 406B. First elements 610A, 610B extend substantially perpendicular to the horizontal conductors 406A, 406B. Second elements 612A, 612B extend substantially perpendicular to the first elements 610A, 610B and parallel to the horizontal conductors 406A, 406B. The third elements 614A, 614B are parallel to the vertical conductors 410, 414, 416, 418. It is to be noted that the first elements 610A, 610B are vertically aligned in a first vertical plane, the second elements 612A, 612B are vertically aligned in a second vertical plane, and the third elements 614A, 614B are aligned within a plane that is perpendicular to the first and second vertical planes. As such, the first elements 610A, 610B, second elements 612A, 612B and third elements 614A, 614B collectively wrap around the vertical conductors 410, 414, 416, 418.

As additionally shown in FIG. 6, selector switches along the same bitline have different areas/volumes. In the embodiment shown in FIG. 6, selector switch 412A coupled between the bitline 202A and the vertical conductor 410 has a greater area/volume than the selector switch 408A coupled between the horizontal conductor 406A and the bitline 202A. In the embodiment shown in FIG. 6, the selector switches 408A, 408B between the horizontal conductors 406A, 406B and the bitlines 202A-202H have a smaller area/volume than the selector switches 412A, 412B between the vertical conductors 410, 414, 416, 418 and the bitlines 202A-202H. It is contemplated that the selector switches 412A, 412B between the vertical conductors 410, 414, 416, 418 and the bitlines 202A-202H may have a smaller area/volume than the selector switches 408A, 408B between the horizontal conductors 406A, 406B and the bitlines 202A-202H. Furthermore, it is also contemplated that the selector switches 412A, 412B may not be identical and that the selector switches 408A, 408B may not be identical such that the smaller selector switch area/volume may be connected to the vertical connector 410, 414, 416, 418 for one bitline 202A-202H while the smaller selector switch area/volume may be connected to the horizontal conductor 406A, 406B for another bitline. The benefit of having different area/volumes for the switching elements is that when equal current is passed through both selector switches for a given bitline, greater voltage occurs across the selector switch having the smaller area/volume. The respective word lines and bitlines may be actively driving a memory cell above or below it so that the voltages will be reversed depositing upon whether going up or down. The selectors are voltage thresholds driven regardless of polarity so bitlines and word lines can be selected in either polarity.

Figure 7:
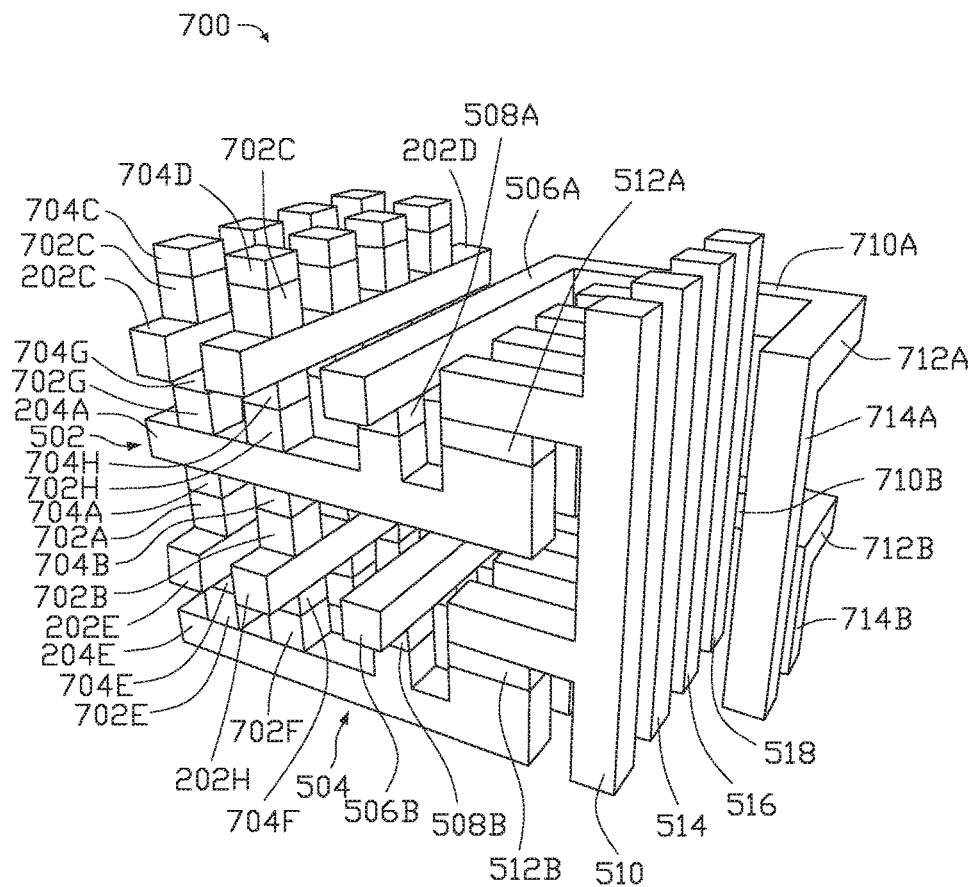
FIG. 7 is a schematic isometric illustration of word lines and bit lines of a cross-point array according to one embodiment.

FIG. 7 is a schematic isometric illustration of word lines and bitlines of a cross-point array 700 according to one embodiment. As shown in FIG. 7, memory elements 702A-702H with selector switches 704A-704H between the word lines 204A, 204E and bitlines 202C, 202D, 202G, 202H. The horizontal conductors 506A, 506B are shown to wrap around the vertical conductors 510, 514, 516, 518 so that the horizontal conductors 506A, 506B connect to the substrate on the same side as the vertical conductors 510, 514, 516, 518 for the word lines 204A, 204E. The connection is made from the horizontal conductors 506A, 506B through respective first elements 710A, 710B, respective second elements 712A, 712B and respective third elements 714A, 714B. Respective first elements 710A, 710B, second elements 712A, 712B and the horizontal conductors 506A, 506B are all disposed in within the same plane for a given horizontal conductor 506A, 506B. First elements 710A, 710B extend substantially perpendicular to the horizontal conductors 506A, 506B. Second elements 712A, 712B extend substantially perpendicular to the first elements 710A, 710B and parallel to the horizontal conductors 506A, 506B. The third elements 714A, 714B are parallel to the vertical conductors 510, 514, 516, 518. It is to be noted that the first elements 710A, 710B are vertically aligned in a first vertical plane, the second elements 712A, 712B are vertically aligned in a second vertical plane, and the third elements 714A, 714B are aligned within a plane that is perpendicular to the first and second vertical planes. As such, the first elements 710A, 710B, second elements 712A, 712B and third elements 714A, 714B collectively wrap around the vertical conductors 510, 514, 516, 518.

As additionally shown in FIG. 7, selector switches along the same word lines have different areas/volumes. In the embodiment shown in FIG. 7, selector switch 512A coupled between the word line 204A and the vertical conductor 510 has a greater area/volume than the selector switch 508A coupled between the horizontal conductor 506A and the word line 204A. In the embodiment shown in FIG. 7, the selector switches 508A, 508B between the horizontal conductors 506A, 506B and the word lines 204A-204H have a smaller area/volume than the selector switches 512A, 512B between the vertical conductors 510, 514, 516, 518 and the word lines 204A-204H. It is contemplated that the selector switches 512A, 512B between the vertical conductors 510, 514, 516, 518 and the word lines 204A-204H may have a smaller area/volume than the selector switches 508A, 508B between the horizontal conductors 506A, 506B and the word lines 204A-204H. Furthermore, it is also contemplated that the selector switches 512A, 512B may not be identical and that the selector switches 508A, 508B may not be identical such that the smaller selector switch area/volume may be connected to the vertical connector 510, 514, 516, 518 for one word line 204A-204H while the smaller selector switch area/volume may be connected to the horizontal conductor 506A, 506B for another bitline. The benefit of having different area/volumes for the switching elements is that when equal current is passed through both selector switches for a given bitline, greater voltage occurs across the selector switch having the smaller area/volume.

It is likely, due to processing irregularities, that one selector switch will switch slightly before the other which might cause a voltage glitch on the bitline (or word line), but the glitch can be controlled so that a false triggering of the targeted memory cell (or other memory cells) will not occur. The glitch control can be controlled by leveraging the capacitance of the bitline (or word line) in a densely packed plurality of bitlines (or word lines) to filter the glitch. In the alternative, the threshold of the memory cells could be designed to be above that which might occur due to a glitch. In a variation of the alternative, the voltage divider formed by the two selector switches can be adjusted by designing the two selector switches to be manufactured in parallel (such that the threshold voltages of the two selector switches is the same due to the matched thickness of the selector switch material) while also designing the two selector switches to have different areas such that a given current flowing in series through the two selector switches will result in a different voltage on each selector switch (i.e., the area determines the relative resistances of the respective selector switches which, following Ohms's Law, will result in a different voltage across each of the two selector switches and an adjusted voltage for the voltage divider formed by these two selector switches). With the matched threshold voltages, the different voltage on each selector switch will result in one selector switch having a higher voltage across it than the other and will thereby allow for a design that can control which selector switch will switch first and what polarity any voltage glitch will assume. Once selected (i.e., the selector switches to the intended bitline or word line have both switched), a small holding current is maintained to keep the selector switches in their low resistance, switched state. The bias voltage for providing the holding current can be adjusted to keep the voltage on the selected bitline (or word line) at a desired voltage level. Note that the area would be changed by increasing the dimension running in parallel with the direction of the bitline (not in the direction orthogonal to the bitline) because the orthogonal direction feature size is constrained to fit within the array pitch.

A 3D cross-point memory array may be fabricated to utilize less substrate area and thus be less complex due to the horizontal and vertical bitline and word line connectors. The selecting switch permits the array to operate efficiently. The array is easy to operate by selecting a bitline and word line to select a particular memory device. Following the selection of a bitline and a word line as described above, the bias voltage of the bitline and the bias voltage of the word line can be used to manipulate the voltage across the memory cell at the intersection of the selected bitline and the selected word line to measure (i.e., read) and alter (i.e., write and/or erase) the state of that memory cell.

While the foregoing is directed to embodiments of the present disclosure, other and further embodiments of the disclosure may be devised without departing from the basic scope thereof, and the scope thereof is determined by the claims that follow.

What is claimed is:

1. A 3D cross-point memory array, comprising:
   a bitline;
   a first selector switch coupled to the bitline;
   a horizontal conductor coupled to the first selector switch, the horizontal conductor being perpendicular to the bitline;
   a second selector switch coupled to the bitline;
   a vertical conductor coupled to the second selector switch, the vertical conductor being perpendicular to the bitline and to the horizontal conductor, wherein the vertical conductor and the horizontal conductor are connected at the same end of the bitline; and
   a memory element coupled to the bitline.

2. The 3D cross-point memory array of claim 1, further comprising a third selector switch coupled to the memory element.

3. The 3D cross-point memory array of claim 2, wherein the first selector switch, the second selector switch and the third selector switch are each an ovonic threshold switch.

4. The 3D cross-point memory array of claim 1, wherein the area of the first selector switch and the area of the second selector switch are different such that when an equal current is passed through the first selector switch and the second selector switch, a greater voltage or field occurs across the selector switch having the smaller area.

5. The 3D cross-point memory array of claim 1, wherein the volume of the first selector switch and the volume of the second selector switch are different such that when an equal current is passed through the first selector switch and the second selector switch, a greater voltage or field occurs across the selector switch having the smaller volume.

6. The 3D cross-point memory array of claim 1, wherein the thickness of the first selector switch and the thickness of the second selector switch are different such that when an equal current is passed through the first selector switch and the second selector switch, a greater voltage or field occurs across the selector switch having the smaller thickness.

7. The 3D cross-point memory array of claim 1, wherein the area, volume and thickness of the first selector switch and the area, volume and thickness of the second selector switch are different such that when an equal current is passed through the first selector switch and the second selector switch, a greater voltage or field occurs across the selector switch having the smaller area, volume and thickness.

8. A 3D cross-point memory array, comprising:
   at least one bitline;
   a first selector switch coupled to the at least one bitline;
   a first horizontal conductor coupled to the first selector switch, the first horizontal conductor being perpendicular to the at least one bitline;
   a second selector switch coupled to the at least one bitline;
   a first vertical conductor coupled to the second selector switch, the first vertical conductor being perpendicular to the at least one bitline and to the first horizontal conductor, wherein the first vertical conductor and the first horizontal conductor are connected at the same end of the at least one bitline;
   at least one word line;

a third selector switch coupled to the at least one word line;
a second horizontal conductor coupled to the third selector switch, the second horizontal conductor being perpendicular to the at least one word line;
a fourth selector switch coupled to the at least one word line;
a second vertical conductor coupled to the fourth selector switch, the second vertical conductor being perpendicular to the at least one word line and to the second horizontal conductor, wherein the second vertical conductor and the second horizontal conductor are connected at the same end of the at least one word line; and
at least one memory element coupled between the at least one bitline and the at least one word line.

9. The 3D cross-point memory array of claim 8, further comprising a fifth selector switch coupled to the at least one memory element.

10. The 3D cross-point memory array of claim 9, wherein the first selector switch, the second selector switch, the third selector switch, the fourth selector switch and the fifth selector switch are each an ovonic threshold switch.

11. The 3D cross-point memory array of claim 8, wherein the first selector switch, the second selector switch, the third selector switch and the fourth selector switch are each an ovonic threshold switch.

12. A 3D cross-point memory array, comprising:
a plurality of bitlines, wherein each bitline has a first connection point and a second connection point, the first connection point and the second connection point being disposed at the same end of the bitline;
a first conductor disposed perpendicular to the plurality of bitlines;
a first selector switch coupled between each first connection point and the first conductor;
a second conductor disposed perpendicular to the plurality of bitlines and the first conductor;
a second selector switch coupled between each second connection point and the second conductor;
a plurality of word lines, wherein each word line has a third connection point and a fourth connection point, the third connection point and the fourth connection point being disposed at the same end of the word line;
a third conductor disposed perpendicular to the plurality of word lines;
a third selector switch coupled between each third connection point and the third conductor;
a fourth conductor disposed perpendicular to the plurality of word lines and the third conductor;
a fourth selector switch coupled between each fourth connection point and the fourth conductor; and
a plurality of memory elements coupled between the plurality of bitlines and the plurality of word lines.

13. The 3D cross-point memory array of claim 12, wherein the first conductor is substantially perpendicular to the second conductor.

14. The 3D cross-point memory array of claim 12, further comprising a fifth selector switch coupled to each memory element.

15. The 3D cross-point memory array of claim 14, wherein the first selector switch, the second selector switch, the third selector switch, the fourth selector switch and the fifth selector switch are each an ovonic threshold switch.

16. The 3D cross-point memory array of claim 15, wherein the plurality of word lines are perpendicular to the plurality of bitlines.

17. The 3D cross-point memory array of claim 12, wherein the first selector switch, the second selector switch, the third selector switch and the fourth selector switch are each an ovonic threshold switch.

18. The 3D cross-point memory array of claim 17, wherein the plurality of word lines are perpendicular to the plurality of bitlines.

19. The 3D cross-point memory array of claim 12, wherein the plurality of word lines are perpendicular to the plurality of bitlines.

20. The 3D cross-point memory array of claim 12, wherein:
the first conductor extends vertically within a first plane;
the second conductor extends horizontally within a second plane that is perpendicular to the first plane.

21. A 3D cross-point memory array, comprising:
a plurality of bitlines, wherein each bitline has a first connection point and a second connection point;
a first conductor;
a first selector switch coupled between each first connection point and the first conductor;
a second conductor;
a second selector switch coupled between each second connection point and the second conductor;
a plurality of word lines, wherein each word line has a third connection point and a fourth connection point;
a third conductor;
a third selector switch coupled between each third connection point and the third conductor;
a fourth conductor;
a fourth selector switch coupled between each fourth connection point and the fourth conductor; and
a plurality of memory elements coupled between the plurality of bitlines and the plurality of word lines;
wherein the first conductor is substantially perpendicular to the second conductor; and
wherein the first conductor is coupled to a first plurality of bitlines of the plurality of bitlines, wherein the second conductor is coupled to a second plurality of bitlines of the plurality of bitlines, and wherein the first plurality of bitlines and the second plurality of bitlines share a common bitline.

22. The 3D cross-point memory array of claim 21, wherein the third conductor is substantially perpendicular to the fourth conductor.

23. The 3D cross-point memory array of claim 22, wherein the third conductor is coupled to a first plurality of word lines of the plurality of word lines, wherein the fourth conductor is coupled to a second plurality of word lines of the plurality of word lines, and wherein the first plurality of word lines and the second plurality of word lines share a common word line.

24. The 3D cross-point memory array of claim 23, further comprising a fifth selector switch coupled to each memory element.

25. The 3D cross-point memory array of claim 24, wherein the first selector switch, the second selector switch, the third selector switch, the fourth selector switch and the fifth selector switch are each an ovonic threshold switch.

26. The 3D cross-point memory array of claim 25, wherein the plurality of word lines are perpendicular to the plurality of bitlines.

27. A 3D cross-point memory array, comprising:
a plurality of bitlines, wherein each bitline has a first connection point and a second connection point;
a first conductor;

a first selector switch coupled between each first connection point and the first conductor;
a second conductor;
a second selector switch coupled between each second connection point and the second conductor;
a plurality of word lines, wherein each word line has a third connection point and a fourth connection point;
a third conductor;
a third selector switch coupled between each third connection point and the third conductor;
a fourth conductor;
a fourth selector switch coupled between each fourth connection point and the fourth conductor;
a plurality of memory elements coupled between the plurality of bitlines and the plurality of word lines;
the first conductor extends vertically within a first plane;
the second conductor extends horizontally within a second plane that is perpendicular to the first plane;
a first element coupled to the second conductor;
a second element coupled to the first element; and
a third element coupled to the second element, wherein the first element, the second element, and the third element collectively wrap around the first conductor and wherein the third element is parallel to the first conductor.

28. The 3D cross-point memory array of claim 27, wherein:
the third conductor extends vertically within a third plane;
the fourth conductor extends horizontally within a fourth plane that is perpendicular to the third plane.

29. The 3D cross-point memory array of claim 28, further comprising:
a fourth element coupled to the fourth conductor;
a fifth element coupled to the fourth element; and
a sixth element coupled to the fifth element, wherein the fourth element, the fifth element, and the sixth element collectively wrap around the third conductor and wherein the sixth element is parallel to the third conductor.

* * * * *